(12) United States Patent
Grötsch et al.

(10) Patent No.: US 9,871,075 B2
(45) Date of Patent: Jan. 16, 2018

(54) OPTOELECTRONIC SEMICONDUCTOR COMPONENT

(71) Applicant: OSRAM Opto Semiconductors GmbH, Regensburg (DE)

(72) Inventors: Stefan Grötsch, Bad Abbach (DE); Matthias Kiessling, Regensburg (DE); Michael Wittmann, Alteglofsheim (DE); Stefan Gruber, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/443,989

(22) PCT Filed: Nov. 21, 2013

(86) PCT No.: PCT/EP2013/074400
§ 371 (c)(1),
(2) Date: May 19, 2015

(87) PCT Pub. No.: WO2014/079939
PCT Pub. Date: May 30, 2014

(65) Prior Publication Data
US 2015/0319814 A1 Nov. 5, 2015

(30) Foreign Application Priority Data
Nov. 21, 2012 (DE) .......... 10 2012 111 247

(51) Int. Cl.
*H05B 33/08* (2006.01)
*H01L 27/15* (2006.01)

(52) U.S. Cl.
CPC .......... *H01L 27/15* (2013.01); *H05B 33/083* (2013.01); *H05B 33/0803* (2013.01); *H05B 33/0815* (2013.01)

(58) Field of Classification Search
USPC ............... 315/185 R, 186, 193, 291, 313
See application file for complete search history.

(56) References Cited

U.S. PATENT DOCUMENTS

| | | | |
|---|---|---|---|
| 6,885,035 B2 | 4/2005 | Bhat et al. | |
| 8,278,767 B2 | 10/2012 | Guenther et al. | |
| 2001/0032985 A1 | 10/2001 | Bhat et al. | |
| 2001/0048459 A1 | 12/2001 | Sakai et al. | |
| 2005/0057193 A1* | 3/2005 | Ono ..................... | G09G 3/3208 315/291 |
| 2006/0164359 A1 | 7/2006 | Kimura | |

(Continued)

FOREIGN PATENT DOCUMENTS

| CN | 1637816 A | 7/2005 |
|---|---|---|
| CN | 102222741 A | 10/2011 |

(Continued)

*Primary Examiner* — Douglas W Owens
*Assistant Examiner* — Jianzi Chen
(74) *Attorney, Agent, or Firm* — Slater Matsil, LLP (57) ABSTRACT

An optoelectronic semiconductor component includes a first functional region having an active zone provided for generating radiation or for receiving radiation, and a second functional region, which is suitable for contributing to the driving of the first functional region. The first functional region and the second functional region are integrated on the same carrier substrate.

18 Claims, 9 Drawing Sheets

(56) References Cited

U.S. PATENT DOCUMENTS

| | | |
|---|---|---|
| 2008/0258695 A1 | 10/2008 | Kumar et al. |
| 2008/0259603 A1 | 10/2008 | Kraus |
| 2010/0060205 A1 | 3/2010 | Vaassen et al. |
| 2010/0134041 A1 | 6/2010 | Radermacher et al. |
| 2011/0199011 A1 | 8/2011 | Nakazawa |
| 2011/0285284 A1 | 11/2011 | Zhou et al. |
| 2015/0014734 A1 | 1/2015 | Choi et al. |
| 2015/0041845 A1 | 2/2015 | Schwarz et al. |

FOREIGN PATENT DOCUMENTS

| | | |
|---|---|---|
| DE | 10221504 A1 | 11/2002 |
| DE | 102007015473 | 10/2008 |
| DE | 102008045653 | 3/2010 |
| EP | 2378555 A2 | 10/2011 |
| JP | S60263483 | 12/1985 |
| JP | 2001284653 A | 10/2001 |
| JP | 2003008083 A | 1/2003 |
| JP | 2006165471 A | 6/2006 |
| JP | 2008034629 A | 2/2008 |
| JP | 2008066454 A | 3/2008 |
| JP | 2009105182 A | 5/2009 |
| JP | 2010527459 A | 8/2010 |
| JP | 2011222999 A | 11/2011 |
| WO | 2010079635 A1 | 7/2010 |
| WO | 2013149772 A1 | 10/2013 |

* cited by examiner

OPTOELECTRONIC SEMICONDUCTOR COMPONENT

This patent application is a national phase filing under section 371 of PCT/EP2013/074400, filed Nov. 21, 2013, which claims the priority of German patent application 10 2012 111 247.9, filed Nov. 21, 2012, each of which is incorporated herein by reference in its entirety.

TECHNICAL FIELD

The invention relates to an optoelectronic semiconductor component having an active zone provided for generating radiation or for receiving radiation.

BACKGROUND

Multi-LED arrangements comprising a plurality of LEDs interconnected with one another are used, for example, in lighting devices in the automotive sector, in particular those which change the illumination direction during cornering and are also designated by the expression "advanced forward lighting system" or AFS system, or in arrays for directly viewed displays, LCD backlighting units or projection systems.

The LED chips or LED components are arranged in arrays in such arrangements and require a plurality of such separate LED components. The LED arrays individually provided on the components are driven by external driver electronics, such that every anode and cathode contact must be given a layout, that is to say be contactable externally.

SUMMARY

Embodiments provide an improved optoelectronic semiconductor component which allows simplified driving.

In embodiments, the optoelectronic semiconductor component comprises a first functional region having an active zone provided for generating radiation or for receiving radiation, and a second functional region, which is suitable for contributing to the driving of the first functional region, wherein the first functional region and the second functional region are integrated on the same carrier substrate.

By virtue of the integration of the first and second functional regions into the same carrier substrate, functional circuit parts of the second functional region are integrated adjacently to the first functional region having the active zone, for example, an LED, on the same carrier substrate. Functional regions are regions of the substrate on which functional circuit parts, that is to say circuit elements or a group of circuit elements, are formed. A circuit element is a smallest fundamental constituent regarded as a unit of a circuit having the function of a component, for example, a transistor or a resistor. The first functional region comprises an active zone for generating radiation or for receiving radiation. Examples of a radiation-emitting circuit element which the first functional region comprises may be an LED or an infrared emitter.

The second functional region can have a switch connected in parallel with the first functional region, that is to say its functional circuit part. For this purpose, the second functional region can comprise a transistor, for example, a field effect transistor, FET for short, by means of which the emitter of the first functional region can be short-circuited.

The second functional region can comprise a pulse width modulation signal generator, which generates a pulse width modulation signal for driving the first functional region. This signal can drive the switch embodied, for example, as a FET.

In one configuration, a plurality of first functional regions are provided, wherein the second functional region is suitable for generating a plurality of signals for driving the first functional regions. Said first functional regions can be connected in series. If the first functional regions are embodied as radiation emitters, individual or each of said radiation emitters can be short-circuitable by a switch, for example, a FET. Said switches can be driven by the pulse width modulation signals of the pulse width modulation signal generator.

Alternatively or additionally, a serial shift register having a data input and a plurality of signal outputs can be provided, the switches being driven by said shift register. The signal outputs are electrically conductively connected to the switches.

In a further configuration, the second functional region on the optoelectronic semiconductor component comprises a current driver or parts thereof for the first functional region or the plurality of first functional regions. As an alternative to the complete or partial integration of the driver, an external wiring by a driver can also be provided.

A driver can be a linear driver suitable for providing the desired supply current for the first functional regions, for example, LEDs, at a supply voltage even higher than the forward voltages of the LEDs. The radiation emitters or LEDs can be supplied by means of a constant-current source. The regulation thereof can be carried out depending on a regulating voltage which is dropped across a resistor in series with the LEDs and is compared with a reference voltage. Said resistor and/or the regulation can be integrated in the second functional region. Other linear driver circuits are also conceivable, of course, which can be embodied in a manner wholly or partly integrated in the second functional region.

In one configuration, an external resistor can be provided, for example, by means of which the desired supply current is set. Said resistor is a separate component which is mounted in a manner electrically conductively connected to the second functional region. Despite a uniform design of the semiconductor component, this allows degrees of freedom in the setting of the supply current by selection and mounting of a resistor which is embodied in a manner not integrated on the same carrier substrate as the functional regions.

Alternatively, a clocked driver can be provided, which provides the supply current. Said driver can be embodied in a manner wholly or partly integrated in the second functional region. Its functional principle is based on the fact that energy built up in coils or capacitors via electronic switches, for example, bipolar transistors or MOSFETs, is transferred cyclically to the radiation emitters to be driven and is adapted to the forward voltage thereof. Both in the case of linear and in the case of clocked drivers, regulating resistors can be provided, which can be embodied in a manner integrated in the second functional region.

In the case of clocked drivers, the electronic switches can be embodied in a manner integrated in the second functional region, and the coil can be provided as a separate component, which coil is connected to the optoelectronic semiconductor component, for example, via a common carrier, such as a circuit board. The detection unit for detecting the regulated variable of the driver can be provided in an integrated fashion or as a separate component group.

As a result of the integration of further functional circuit parts on the same carrier substrate on which the active zones are situated as well, the driving electronics can be implemented significantly more simply than in the case of completely external control, since at least some discrete components are omitted and together with them possible interference sources during their mounting, with the result that the system becomes more reliable. Moreover, a plurality of active zones can be arranged on a confined space, which increases the pixel density of the entire arrangement since the required outlay in terms of routing and interconnection on the carrier or the printed circuit board on which the semiconductor component is mounted is reduced.

The active zone of the first functional region can extend in a luminous epitaxial layer, such that the second functional region can at least partly extend below said epitaxial layer.

The second functional region can at least partly extend between the active zones of two of the plurality of first functional regions. This allows a compact configuration of the semiconductor component.

By virtue of the integration of driving functions on the semiconductor component, in the simplest case a string of radiation emitters can be operated merely with connections for applying an external supply voltage or an external supply current, an external data signal and an external clock signal.

The integration of driving functions can be used in fields in which lighting applications for sensor technology require short rise and fall times, for example, in so-called time-of-flight cameras, TOF cameras for short, in order to minimize said rise and fall times. Fast circuits, owing to their low line capacitances and inductances and resistive portions, otherwise require a complex design of the lines from the driver to the LED for the purpose of minimizing the rise and fall times and also high driver voltages in high-current applications, owing to the voltage-current relationship $U=L*dI/dt$ and capacitive influences from $U=U_0*e^{(-t/\tau)}$. The integration of functional circuit parts into the carrier substrates adjacently to the active zone results in a shortening of the line lengths for the high-current path from the driver, for example, FET, to the LED as a result of the integration of the switch, for example, FET, adjacently to the LED, which minimizes parasitic portions. The inductances and resistive portions are reduced, which allows simplified driving for optimizing the switching times, in particular with regard to the rise and fall thereof. A suitable signal shaping of the optical power emitted by the LED can be influenced by means of the temporal profile of the control voltage and does not have to take account of the line properties in the line path from an external driver to the LED.

BRIEF DESCRIPTION OF THE DRAWINGS

The invention is explained below on the basis of exemplary embodiments with reference to the drawing. Identical reference signs designate identical or functionally similar features.

In the figures.

DETAILED DESCRIPTION OF ILLUSTRATIVE EMBODIMENTS

Figure 1:
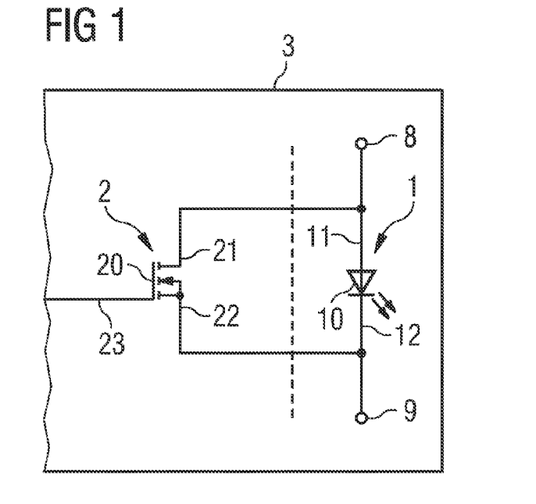
FIG. 1 schematically shows one exemplary embodiment of an optoelectronic semiconductor component comprising an LED and a short-circuiting component.

FIG. 1 schematically shows one exemplary embodiment of an optoelectronic semiconductor component. This exemplary embodiment illustrates a basic structure of an optoelectronic semiconductor component, which can also be designated as chip, comprising a first functional region 1 having an active zone provided for generating radiation or for receiving radiation, and a second functional region 2, which is suitable for contributing to the driving of the first functional region 1. This means that operational setting and/or supply of the first functional region are/is at least partly effected via the second functional region, for example, by virtue of the operating state of the first functional region being set by means of the second functional region while the first functional region is supplied with current via an external supply.

The first and second functional regions 1, 2 are embodied in a manner integrated on the same carrier substrate 3. This can be a silicon carrier substrate, but a germanium carrier substrate is also conceivable.

Each functional region 1, 2 serves as a functional circuit part having the function of one or a plurality of components and the connecting lines thereof. The functional circuit parts are electrically coupled to one another. The circuit parts formed in the first functional region 1 are radiation-emitting or -receiving. The radiation can be electromagnetic radiation, for example, in the infrared range or in the range of visible light. Circuit parts by means of which the first functional region 1 or the functional circuit part in the first functional region 1 can be driven are formed in the second functional region 2.

The dashed line illustrates the separation between the first and second functional regions 1, 2. It should be noted that the functional regions 1, 2 can be arranged not only alongside one another, as illustrated, but also at least partly one above another, for example, by virtue of the functional regions 1, 2 being formed in different planes.

The first functional region 1 comprises an LED 10 having connection points, for which can also be designated as terminals—as used hereinafter. The LED 10 has a first terminal 11, which in this case is an anode terminal, and a second terminal 12, which is a cathode terminal. The LED 10 is fed by an external current source via connections 8, 9, electrically conductively connected to the terminals 11, 12. The connections 11, 12 are suitable for connecting the first and/or second functional regions 1, 2 to external circuit arrangements. This can be carried out by means of customary connecting techniques, for example, soldering.

The second functional region 2 comprises a field effect transistor, FET for short, 20 serving as a switch and having a first, second and third terminal 21, 22, 23, which serve as drain, source and gate terminals. The first terminals 11, 21 of the LED 10 and of the FET 20 are electrically conductively connected to one another, as are the second terminals 12, 22 thereof. The FET 20 can be switched back and forth between a blocking state and a conducting state, in which the path between the first and second terminals 21, 22 is at high impedance and respectively at low impedance or conducting. Said FET serves as a switch in order to switch the LED 10 between a radiation-emitting state and a non-emitting state, that is to say on or off; in the last-mentioned case, the terminals 11, 12 of the LED 10 are short-circuited by the conducting FET 20, and in the other case they are not. For switching purposes, there is applied to the third terminal 23 of the FET 20 a switching signal having a first or a second state, by means of which the FET 20 can be switched into the conducting state or the blocking state depending on the state of the switching signal.

The states of the switching signal correspond to a high and low potential, which can also be designated as "high" and "low". The normally off FET 20 illustrated in FIG. 1 is in the blocking state if no positive voltage is present between gate and source terminals, that is to say third and second terminals 23, 22. Such a FET 20 is blocking in the case of the switching signal "low", such that the LED 10 is switched on, and conducting in the case of the switching signal "high", such that the LED 10 is switched off. With the use of other types of FET or switch, the switching states associated with "high" and "low" may differ from the example described.

The switching signal can be provided by an external circuit arrangement and applied via a connection or can be generated internally in a functional region (neither alternative is illustrated in FIG. 1).

Figure 2:
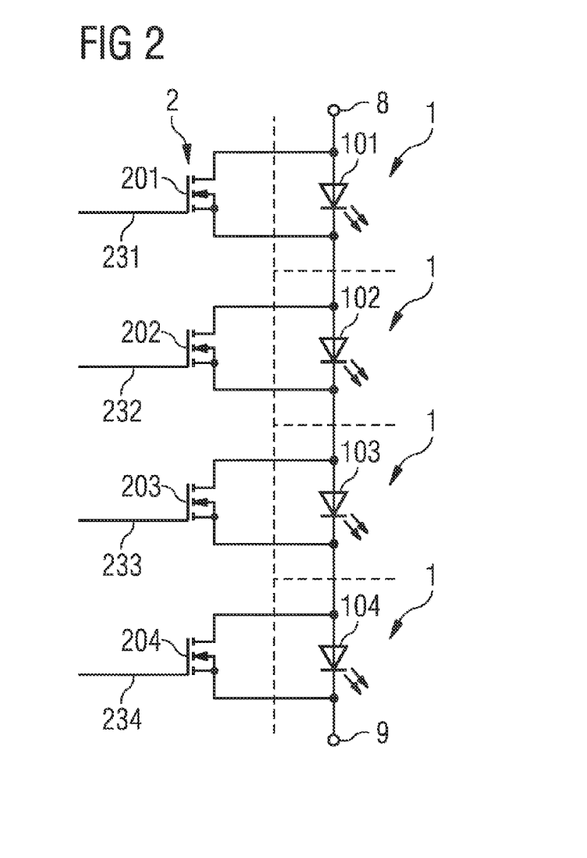
FIG. 2 schematically shows one exemplary embodiment of an optoelectronic semiconductor component comprising a plurality of short-circuitable LEDs.

FIG. 2 shows a further exemplary embodiment comprising a plurality of first functional regions 1 and a second functional region 2, which are suitable for contributing to the driving of the first functional regions 1. For the sake of clarity, as in the following figures, the illustration of the substrate is dispensed with.

The first functional regions 1 respectively comprise an LED 101, 102, 103, 104, which are connected in series between connections 8, 9 for an external current source, that is to say that the first terminal of the first LED 101 is electrically conductively connected to one of the connections 8. The second terminal thereof is electrically conductively connected to the first terminal of the second LED 102. The second terminal thereof is electrically conductively connected to the first terminal of the third LED 103. The second terminal thereof is electrically conductively connected to the first terminal of the fourth LED 104. The terminal thereof is electrically conductively connected to the other of the connections 9.

Each of the LEDs 101, 102, 103, 104 is connected in parallel with a FET 201, 202, 203, 204 in the second functional region 2, as has been described with regard to the exemplary embodiment shown in FIG. 1.

The third terminals 231, 232, 233, 234 at the FETs 201, 202, 203, 204 make possible the driving of each FET 201, 202, 203, 204 and thus also the switching of the LEDS 101, 102, 103, 104 respectively connected thereto. This means that, depending on the switching signals present at the third terminal 231, 232, 233, 234, the LEDs 101, 102, 103, 104 in the string are in each case individually bridgeable and thus capable of being turned off.

Figure 3:
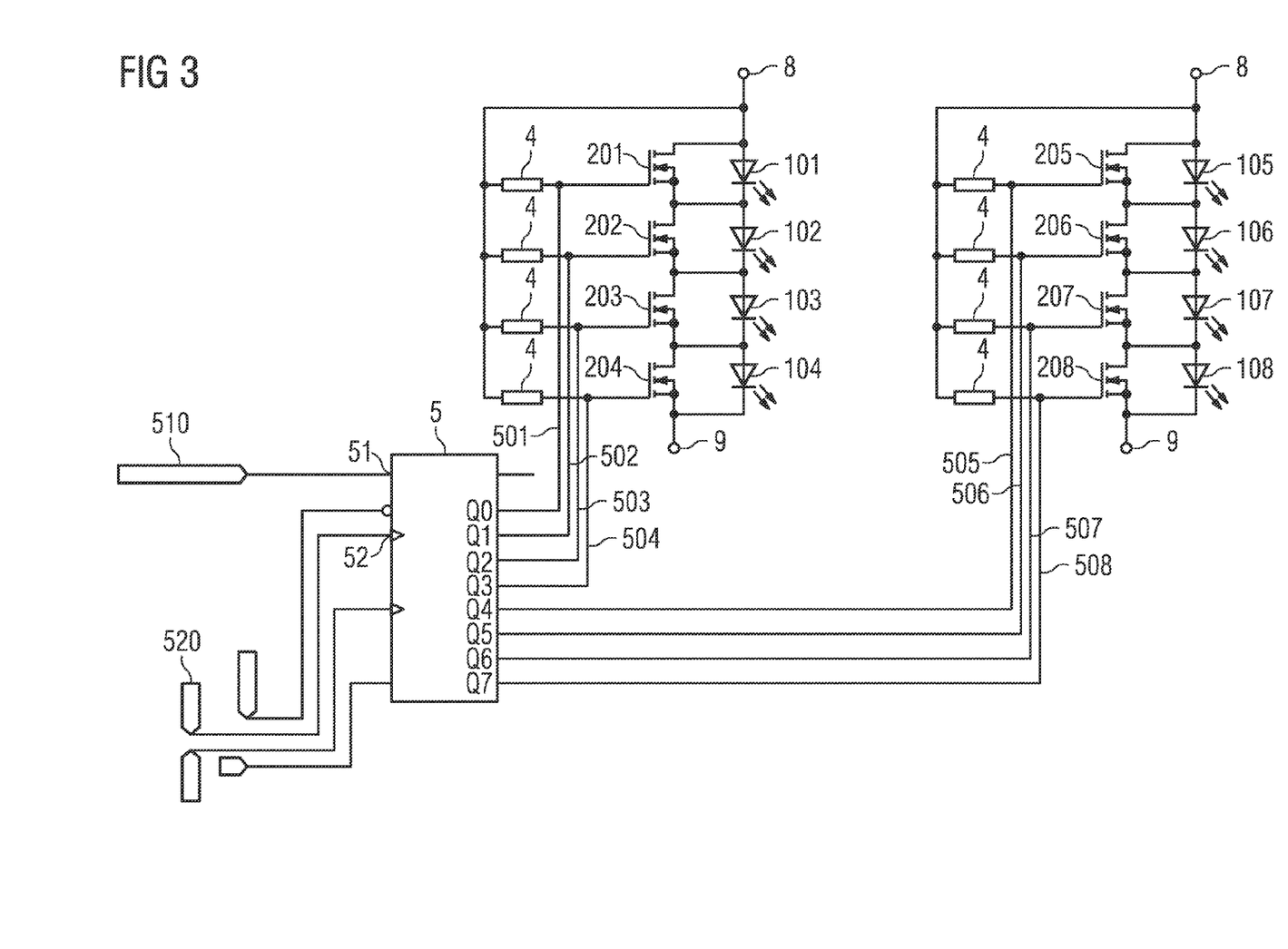
FIG. 3 shows one exemplary embodiment of an optoelectronic semiconductor component comprising a plurality of short-circuitable LEDs and a shift register.

FIG. 3 shows a further exemplary embodiment comprising a multiplicity of first functional regions configured as two strings of series-connected LEDs 101, 102, 103, 104 and 105, 106, 107, 108. Two strings each having four LEDs 101, 102, 103, 104 and 105, 106, 107, 108 are shown by way of example in this exemplary embodiment. The two strings are supplied by an external current source (not illustrated) via the connections 8, 9. The anode terminal of the outer LEDs 101, 105 of the strings is electrically conductively connected to a first connection 8. The cathode terminal of the outer LEDs 104, 108 of the strings is electrically conductively connected to a second connection 9.

Each of the LEDs 101, 102, 103, 104, 105, 106, 107, 108 can be short-circuited via a parallel-connected FET 201, 202, 203, 204, 205, 206, 207, 208. The FETs 201, 202, 203, 204, 205, 206, 207, 208 are driven via their third terminals 231, 232, 233, 234, 235, 236, 237, 238.

The third terminals 231, 232, 233, 234, 235, 236, 237, 238 are in each case electrically conductively connected to the first connection 8 via a series-connected resistor 4.

Furthermore, a serial shift register 5 is provided, which is likewise embodied in a manner integrated in the second functional region. The integrated serial shift register 5 has a data input 51 for a data signal 510, a clock input 52 for a clock signal 520 and a plurality of outputs Q0, Q1, Q2, Q3, Q4, Q5, Q6, Q7. Additional inputs such as Reset Clock, Serial Clear, G(Latch) are optional. By means of the shift register 5, data present serially at the data input 51 are provided at the outputs Q0, Q1, Q2, Q3, Q4, Q5, Q6, Q7. This allows the incoming data to be parallelized, such that, despite serial inputting, data patterns having a plurality of bits can be provided simultaneously on the output side. Each of the outputs Q0, Q1, Q2, Q3, Q4, Q5, Q6, Q7 is electrically conductively connected to one of the third terminals 231, 232, 233, 234, 235, 236, 237, 238 via a respective signal line 501, 502, 503, 504, 505, 506, 507, 508, such that each of the outputs Q0, Q1, Q2, Q3, Q4, Q5, Q6, Q7 drives one of the FETs 201, 202, 203, 204, 205, 206, 207, 208 depending on the states present at the outputs Q0, Q1, Q2, Q3, Q4, Q5, Q6, Q7 and thus one of the LEDs 101, 102, 103, 104, 105, 106, 107, 108. By way of example, the output Q0 drives the first FET 201 and thus the first LED 101. The output Q1 drives, for example, the second FET 202 and thus the second LED 102. The other LEDs 103, 104, 105, 106, 107, 108 are driven in a corresponding manner.

Such an optical semiconductor component comprises a multiplicity of functional circuit parts integrated on the same carrier substrate. Only a small number of connections routed toward the outside are required, in this case, for example, the connections 8, 9 for the external current source and also the data and clock connections 51, 52. In the simplest case, an LED string having only two supply connections can be operated with a single data signal 510 given a fixed clock rate. This allows a simplified configuration of the driving electronics since a portion of the components and functions are already integrated on the optoelectronic semiconductor component. With the resultant at least reduced outlay in terms of mounting for separate components, risks of failure which are associated therewith and which can occur, for example, at connecting locations of the components are also omitted, and the system comprising the optoelectronic semiconductor component is more reliable overall.

Figure 4:
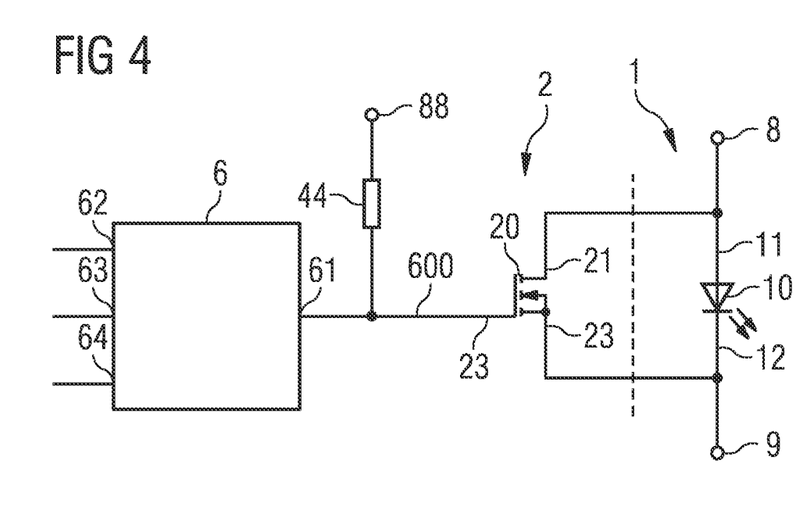
FIG. 4 schematically shows one exemplary embodiment of an optoelectronic semiconductor component comprising an LED and a pulse width modulation signal generator.

FIG. 4 shows a further exemplary embodiment, showing a basic cell comprising an LED 10 having a first and second terminal 11, 22 in a first functional region 1. This exemplary embodiment illustrates the driving of the LED 10 by a pulse width modulation signal generator 6, PWM signal generator for short, for example, in order to obtain a dimming effect by the LED 10 being switched on and off in a targeted manner.

The LED 10 can be supplied by an external current source (not illustrated) by means of the connections 8, 9, which are electrically conductively connected to the terminals 11, 12 of the LED 10. The second functional region 2 comprises a FET 20, the first and second terminals 21, 22 of which are electrically conductively connected to the first and second terminals 11, 12, respectively, of the LED 10. The third terminal 23 of the FET 20 serves for driving the FET 20 acting as a switch, and thus for switching the LED 10 on and off.

The pulse width modulation signal generator 6 comprises an output 61 and also a data input 62 and a clock input 64. Further inputs, for example, a select input 63, are optional. The pulse width modulation signal generator 6 is integrated on the same carrier substrate as the other functional circuit parts. The pulse width modulation signal generator 6 generates a pulse width modulation signal which can assume a first state or a second state. The states alternate, wherein the duration of the states depends on the input signal. The pulse width modulation signal generator 6 can comprise an n-bit memory to which a value for the pulse width modulation can be written via the data input 62. During operation, one of the states is initially present at the output 61 of the pulse width modulation signal generator 6. The value of the generator-internal counter is cyclically increased step by step and, when the stored value is reached, the state at the output 61 of the pulse width modulation signal generator 6 changes, which brings about a changeover of the FET 20. When a predefined final value of the counter is reached, the latter and likewise the state of the output 61 are reset and then cyclically increased again step by step.

The output 61 is electrically conductively connected to the third terminal 23 via a control line 600. A pull-up resistor 44 is electrically conductively connected to the third terminal 23 and a connection 88 for applying a high switching potential. If the pulse width modulation signal, PWM signal for short, at the output 61 of the pulse width modulation signal generator 6 has a first state, the pull-up resistor 44 pulls the potential of the third terminal 23 to that of the connection 88. If the pulse width modulation signal at the output 61 has a second state, the potential at the third terminal 23 falls. The FET 20 is conducting or blocking depending on the potential present at the third terminal 23, or the gate-source voltage, and thus switches the LED 10 off or on.

Figure 5:
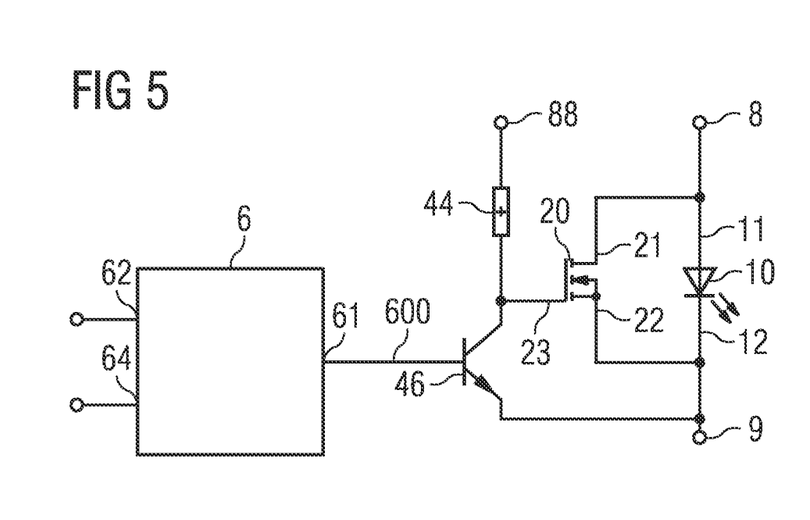
FIG. 5 schematically shows a further exemplary embodiment of an optoelectronic semiconductor component comprising an LED and comprising a pulse width modulation signal generator.

FIG. 5 shows a further exemplary embodiment of a basic cell comprising an LED 10, with which a FET 20 is connected in parallel, and a pulse width modulation signal generator 6 having a data input 62, a clock input 64 and an output 61.

The third terminal 23 of the FET 20 is electrically conductively connected via a pull-up resistor 44 to a connection 88 for applying a high switching potential. The third terminal 23 is furthermore connected via the collector-emitter path of a bipolar transistor 46 to the connection 9 for supplying the cathode terminal 12, which has a lower potential than the connection 88. The base connection of the transistor 46 is electrically conductively connected to the output 61 of the pulse width modulation signal generator 6. The transistor 46 serves as a switch which is either conducting or blocking depending on the state present at the output 61. If the transistor 46 is in the blocking state, the pull-up resistor 44 pulls the potential of the third terminal 23 to that of the connection 88. If the transistor 46 is conducting, the pull-up resistor 44 loses this function and the potential of the third terminal 23 is pulled to that of the supplying connection 9, which can be ground, for example. The FET 20 is conducting or blocking depending on the potential present at the third terminal 23. If the state of the output 61 is "low", for example, the base voltage at the transistor 46 vanishes and the collector-emitter path thereof is at high impedance. In this case, the potential of the third terminal 23 is pulled to that of the connection 88 by the pull-up resistor 44 and the FET 20 becomes conducting and short-circuits the LED 10. Conversely, if the state of the output 61 is "high", the base voltage present at the transistor 46 has the effect that the transistor 46 becomes conducting and, as a result, the potential at the third terminal 23 falls. The FET 20 is in the blocking state and the LED 10 emits radiation.

Complementary transistors, for example, two complementary FETs, can also be used as an alternative to the pull-up resistor 44.

The exemplary embodiments shown in FIGS. 4 and 5, on account of the integration of essential circuit parts on the carrier substrate, also have only a small number of connections via which the external operating control is effected. In these exemplary embodiments, connections 8, 9 for an external current source, a connection 88 for the potential of a logic state, and also a data and a clock input 62, 64 are provided.

Figure 6:
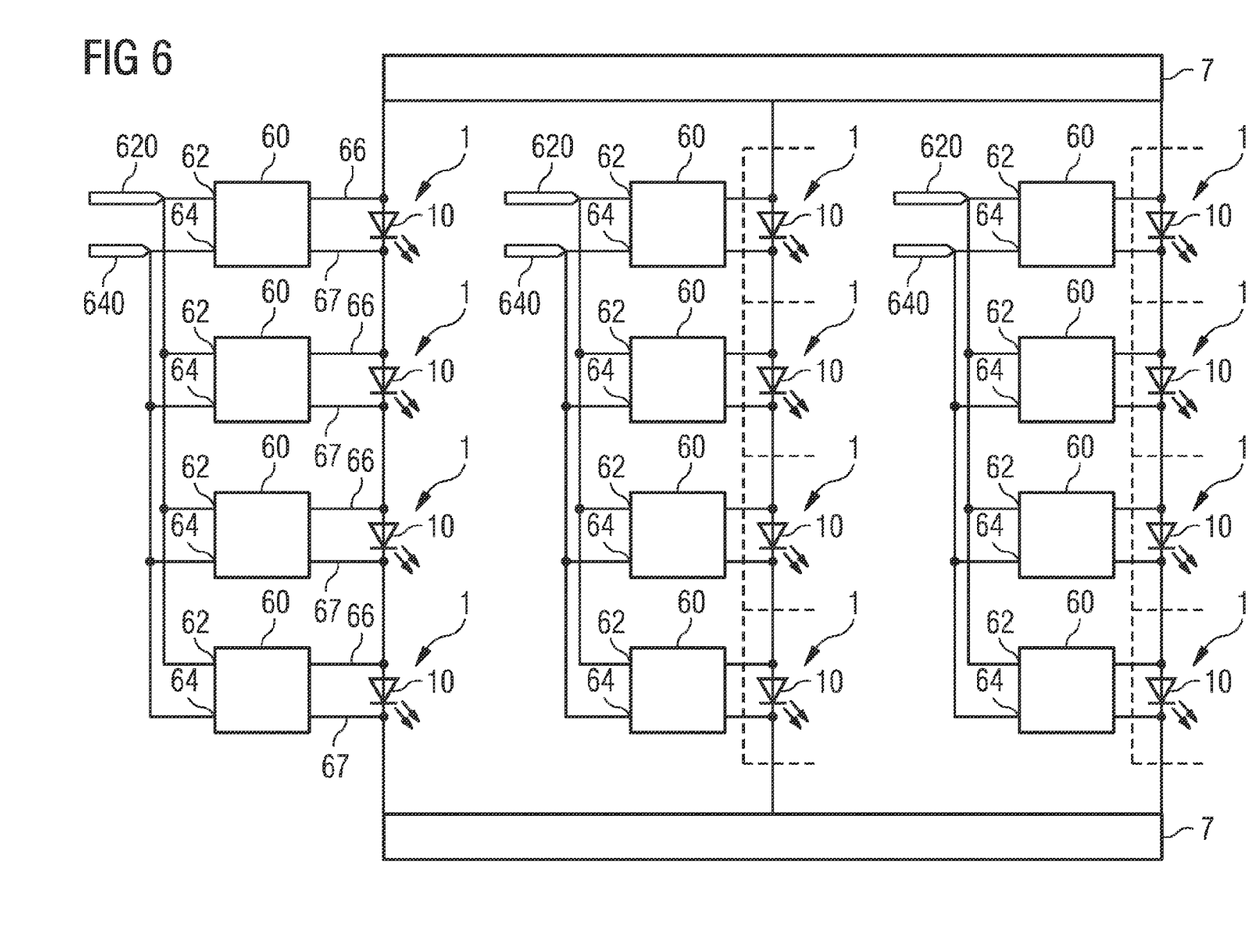
FIG. 6 schematically shows one exemplary embodiment of an optoelectronic semiconductor component comprising a plurality of LEDs and pulse width modulation signal generators.

FIG. 6 schematically shows a further exemplary embodiment comprising a multiplicity of first functional regions 1 each comprising an LED 10. An array of three LED strings each having four series-connected LEDs 1 is shown in this exemplary embodiment; the number of LEDs 10 and strings is merely by way of example. The strings are supplied by a current source 7 embodied in a manner wholly or partly integrated on the carrier substrate. Alternatively, the current source can be provided externally.

Each of the LEDs 1 is driven by a pulse width modulation signal generator 60, which differs from those described above in that it has two output terminals 66, 67, which are electrically conductively connected to the terminals of the LED 10. In a first state, the generator-internal path between the output terminals 66, 67 is at high impedance, which is associated with a switched-on LED 10. In a second state, the generator-internal path between the output terminals 66, 67 is short-circuited, which is associated with a short-circuited LED 10. Such a pulse width modulation signal generator 60 corresponds to the pulse width modulation signal generators 60 shown in FIGS. 4 and 5 including the connected FET 20 for switching the LED 10. Its first and second terminals 21, 23 correspond to the output terminals 66, 67. The driving is carried out via data and clock inputs 62, 64 in the same way as described above.

In this exemplary embodiment, the LEDs 10 of a string are driven with the same data signal 620 and the same clock signal 640 present at all the data and clock inputs 62, 64.

The integration of LEDs and functional regions in or on the same substrate allows the production of compact semiconductor components since the integrated functional regions and LEDs need not be mounted as a separate component on the substrate. Exemplary embodiments of such semiconductor components comprise an integrated series current regulator, for example, or allow a conventional three-wire bus to be reduced to one wire.

Figure 7:
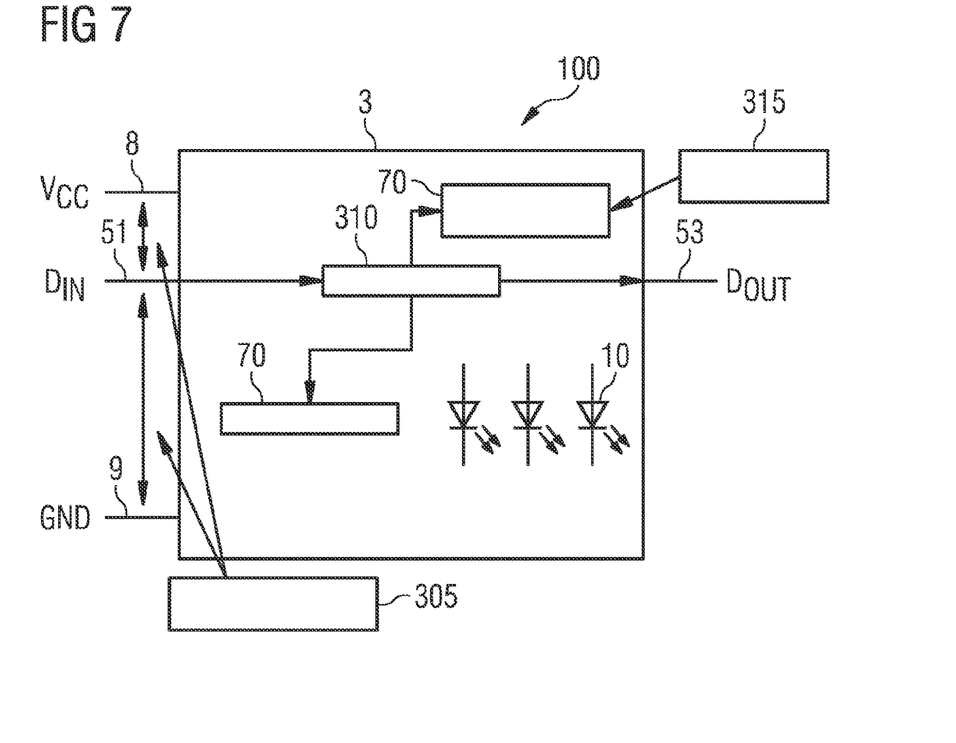
FIG. 7 schematically shows one exemplary embodiment of an optoelectronic semiconductor component comprising integrated LEDs and functional regions.

FIG. 7 schematically shows one exemplary embodiment of an optoelectronic semiconductor component 100 with integrated controller and LEDs on the same carrier substrate 3. The exemplary embodiment has two supply connections 8, 9 and a data input 51, at which a data input signal Din is present. Furthermore, a data output 53 is provided, at which the data input signal Din is present as data output signal Dout. The supply potential Vcc and a reference potential GND are present at the supply connections 8 and 9, respectively.

Means for overvoltage protection 305 are provided between the supply connections and the data input 8, 51 and 51, 9 in order to prevent damage resulting from electrostatic discharges (ESD). Voltage limiters are appropriate for this, for example, which can also be integrated on the carrier substrate 3 of the semiconductor component 100.

Data input and output 51, 53 are connected to a digital I/O port 310, which is integrated on the semiconductor component 100. If a value is applied to the data input 51, the electrical signal at the data output 53 is correspondingly changed. The I/O port 310 can also be embodied as a shift register.

Furthermore, a pulse width modulation signal generator 6 and a constant-current source 70 are integrated on the substrate 3 of the semiconductor component 100. Exemplary embodiments particularly of pulse width modulation signal generators 6 have already been described above and can also be provided in this way in this exemplary embodiment. The data of the digital I/O port 310 are present both at the pulse width modulation signal generator 6 and at the constant-current source 70 in order to drive them depending on the input data Din. Additionally or alternatively, the pulse width modulation signal generator 6 can be coupled to the constant-current source 70, which for its part is coupled to the LED(s) 10. In one exemplary embodiment in which the pulse width modulation signal generator 6 is coupled to the constant-current source 70, data of the digital I/O port 310 are present at the pulse width modulation signal generator 6 and not at the constant-current source 70. In a further exemplary embodiment, e.g., by means of a leading signal bit or by means of a specific PWM value (e.g., 255 or 1), a value for the current is transmitted, which flows into registers which drive the respective constant-current sources of an LED. Without this data identification, the transmitted values flow as PWM setpoint value into the pulse width modulation signal generator 6.

Furthermore, one or a plurality of LEDs 10 are provided in a manner integrated on the substrate 3 of the semiconductor component 100, which are merely illustrated schematically in FIG. 7. With regard to their arrangement and interconnection, the arrangements in the exemplary embodiments described above are appropriate, for example, a chain of series-connected LEDs 10 or an array comprising a plurality of LED chains. One or a plurality of LEDs 10 can be provided, for example, an arrangement of three RGB LEDs or four white LEDs or nine white LEDs. The LEDs 10 are supplied and driven by the constant-current source 70. In one exemplary embodiment, one LED is provided, which lies with a series current regulator between the supply and reference potentials VCC and GND.

Furthermore, provision can be made of means 315 for error detection for the LEDs 10. Such means 315 are suitable for detecting the failure or short circuit of one or a plurality of LEDs 10, for example, on the basis of current or voltage changes over an LED chain. They can likewise be integrated on the substrate 3 of the semiconductor component.

Figure 8:
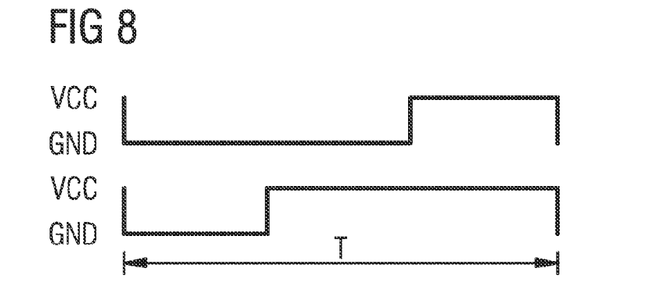
FIG. 8 shows one exemplary embodiment of data transfer via a data bus with fixed frequency.

FIG. 8 shows one exemplary embodiment of a data transfer via a data bus with fixed frequency, such as can be used, for example, for the exemplary embodiment in FIG. 7. Such a single-wire bus can also be used in the original part of the arrangement. The frequency can be 400 kHz, 800 kHz or 1.6 MHz, for example. The bits 1 and 0 are coded by different on/off ratios. This means that the ratio between the time duration at which the potential Vcc is present and the time duration at which the reference potential GND is present differs for the bits 0 and 1.

FIG. 8 shows the temporal profile of the potential during a period T for the bit 1 (top) and the bit 0 (bottom) by way of example. The bit 1 is coded in such a way that the potential Vcc is present over a longer period of time than for the coding of the bit 0. A resetting of the state or "reset" can be carried out by means of a relatively long pause, which lasts longer than 50 clock cycles T, for example, and during which the reference potential GND is present.

Figure 9:
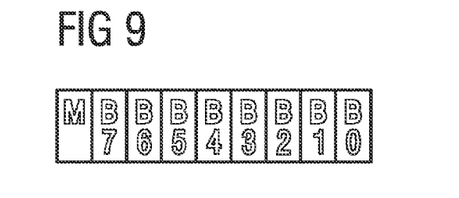
FIGS. 9 and 10 show exemplary embodiments of a data format for the data transfer via a data bus with fixed frequency.

FIG. 9 shows one exemplary data packet format for driving an LED 10 of one color. The data packet comprises nine bits M, B7 to B0. The leading bit M codes the type of driving. The value 0, for example, stands for pulse width modulation, the value of which is transmitted in the bits B0 to B7. The value 1 signals the binary value for the constant current. The bits B7 to B0 code the value for the pulse width modulation or for the setting of the current.

Figure 10:
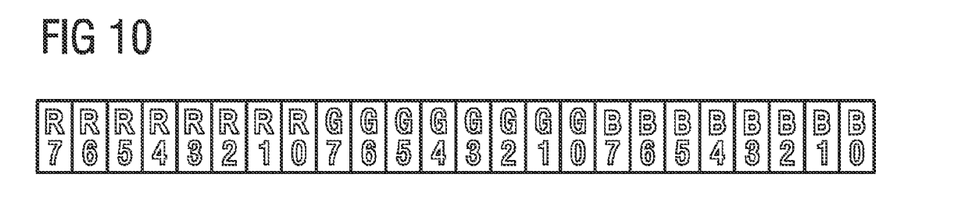

FIG. 10 shows one exemplary data packet format for driving a plurality of LEDs, for example, three LEDs, having the colors red, green, blue, or RGB for short. The data packet comprises three bytes, one for each color, having the bits R7 to R0 for red, G7 to G0 for green, B7 to B0 for blue. The bytes in each case carry the information for the pulse width modulation or for the setting of the current of the respective color.

Figure 11A:
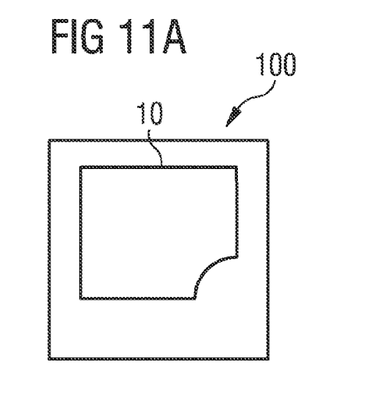
FIGS. 11a and 11b show the front sides of exemplary embodiments of a semiconductor component.
Figure 11B:
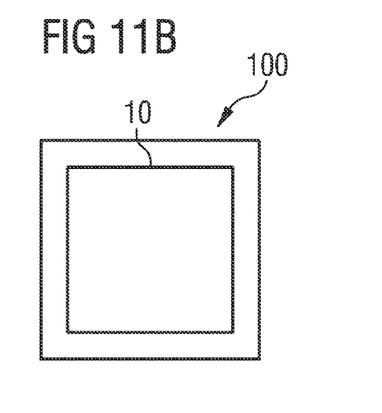

FIGS. 11a and 11b show the front side of one exemplary embodiment of a semiconductor component 100 comprising an LED 10, which can be white or yellow, for example, and in which functional regions for driving the LED 10 are integrated with the latter on the same substrate. Such functional regions can be, for example, the functional regions described in FIG. 7. Configuration of the light-emitting region different than those shown in the exemplary embodiments are conceivable.

Figure 12:
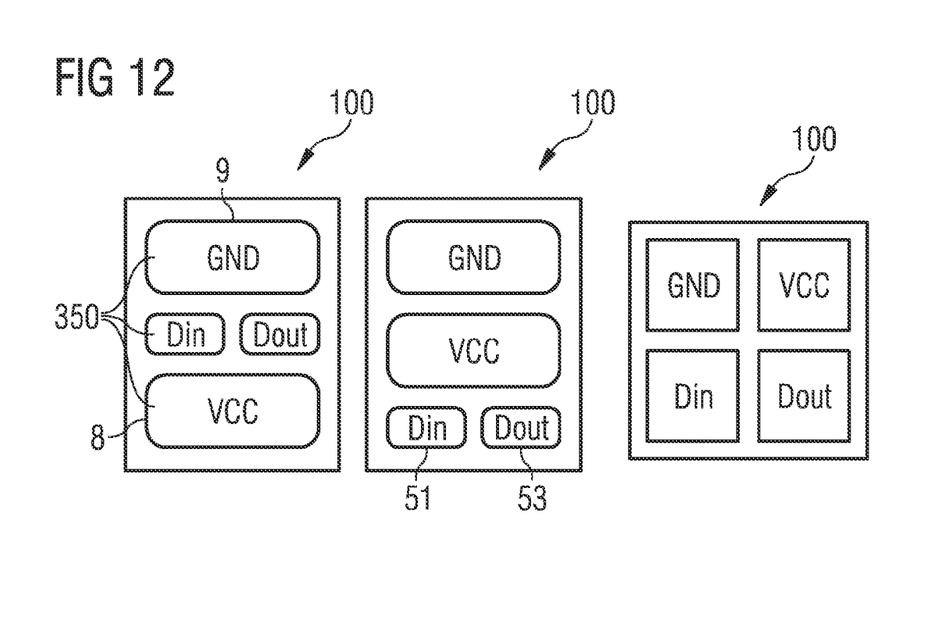
FIG. 12 shows exemplary rear sides of the semiconductor components from FIGS. 11a and 11b.

FIG. 12 shows exemplary embodiments of rear sides of the semiconductor component 100 from FIG. 10. The rear sides have contact regions 350 which serve as supply connections 8, 9 for applying the supply and reference potentials Vcc, GND and serve as data input and output 51, 53 for applying and providing the input and output data Din, Dout, respectively. The input data Din can have the format illustrated in FIG. 9, for example.

In the left-hand exemplary embodiment, the contact regions 350 for input and output data Din, Dout are provided between the contact regions 350 for supply and reference potentials Vcc, GND. In the middle exemplary embodiment, contact regions 350 for input and output data Din, Dout are provided below the contact regions 350 for supply and reference potentials Vcc, GND. In these exemplary embodiments, the contact regions 350 for supply and reference potentials Vcc, GND are larger than the other contact regions. Other arrangements of the contact regions 350 are conceivable. In the right-hand exemplary embodiment, the contact regions 350 have the same size and are arranged symmetrically in each case in a quadrant.

Figure 13A:
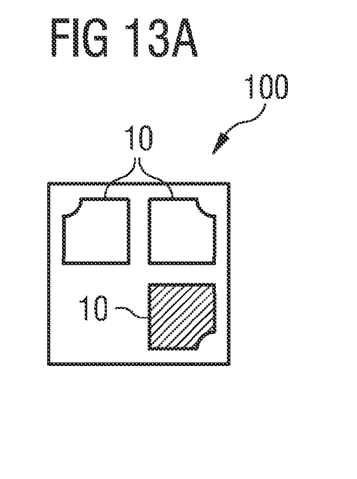
FIGS. 13a, 13b, 14a and 14b show the front side of further exemplary embodiments of a semiconductor component.

FIG. 13a shows the front side of a further exemplary embodiment of a semiconductor component 100 comprising three LEDs 10 in different colors, for example, red, green and blue. The rear side can be configured in a manner similar or identical to that described for FIG. 12. The input data Din for this exemplary embodiment can have the format illustrated in FIG. 10, for example.

Figure 13B:
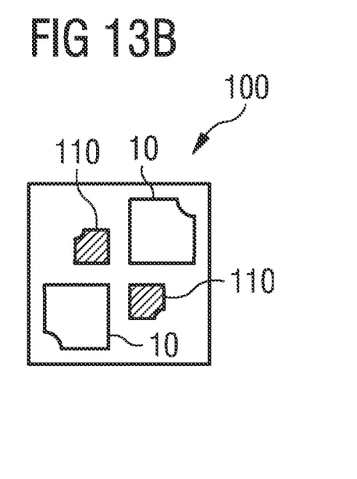

FIG. 13b shows the front side of a further exemplary embodiment of a semiconductor component 100 comprising four LEDs 10. One green and one blue LED 10 and two red LEDs 110 are provided. The latter are interconnected as a string or chain, which reduces the power loss. The rear side can be configured in a manner identical or similar to that described for FIG. 12.

The use of two small red LEDs, in combination with yellow and blue LEDs, allows the supply voltage overhead to be kept small. This shall be illustrated by the following example: the voltage across the chain of two red LEDs is Vf=1.8V×2=3.6V; said value Vf is also present in each case across the yellow and blue LEDs.

Figure 14A:
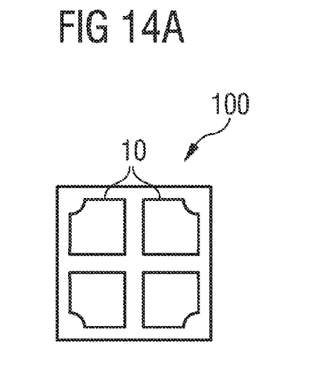

FIG. 14a shows the front side of a further exemplary embodiment of a semiconductor component 100 comprising four white LEDs 10 of identical size, which are arranged in two rows and two columns.

Figure 14B:
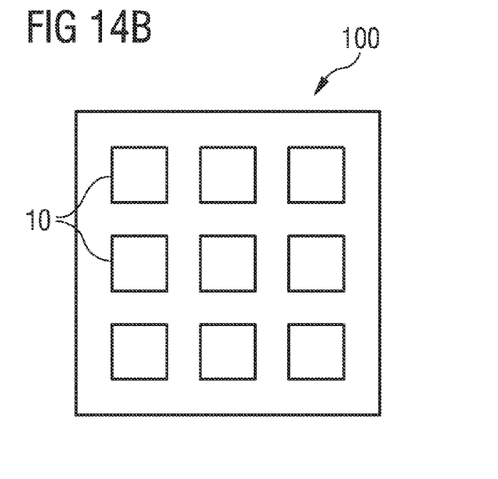

FIG. 14b shows the front side of a further exemplary embodiment of a semiconductor component 100 comprising nine white LEDs 10 of identical size, which are arranged in three rows and three columns.

The advantage of these arrangements is that the SMT pads or contact areas for embodiments of surface-mounted devices ("SMD" for short) can be larger than in the case of components comprising only one chip.

Figure 15:
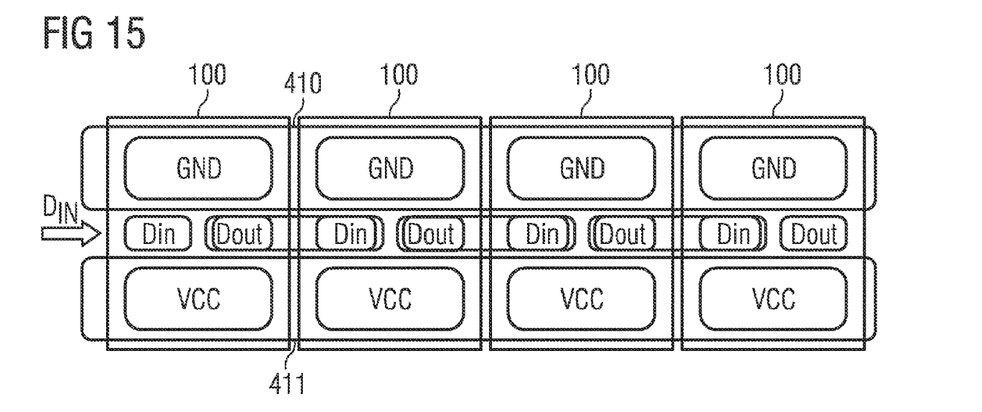
FIG. 15 shows the rear side of an arrangement comprising four semiconductor components.

FIG. 15 shows the rear side of an arrangement comprising four semiconductor components 100 arranged alongside one another, in the case of which semiconductor components the supply voltage is applied in parallel. This can be carried out by means of a conductor track 411, for example, which makes contact with the contact regions 350 for the supply potential Vcc and applies the supply potential Vcc thereto. A further conductor track 410 makes contact with the contact regions for the reference potential GND, such that the reference potential GND is present at the contact regions. Instead of conductor tracks, alternative conductor structures on a carrier on which the semiconductor components 100 are mounted, or other contacting means can also be provided.

The data output of a first semiconductor component is connected to the data input of a second semiconductor component, for example, via a rail or conductor structure. The data output of the second semiconductor component is connected to the data input of a third semiconductor component. The data output thereof is connected to the data input of a fourth semiconductor component. This arrangement can be continued.

The data signal Din is applied to the data input of the first semiconductor component and shifted through the digital I/O ports of the series-connected semiconductor components 100. The shift register arrangement outlined has minimal routing distances and allows a compact arrangement with simple driving. By means of data inputs and outputs coupled in this way, a plurality of components can be addressed in series.

Figure 16:
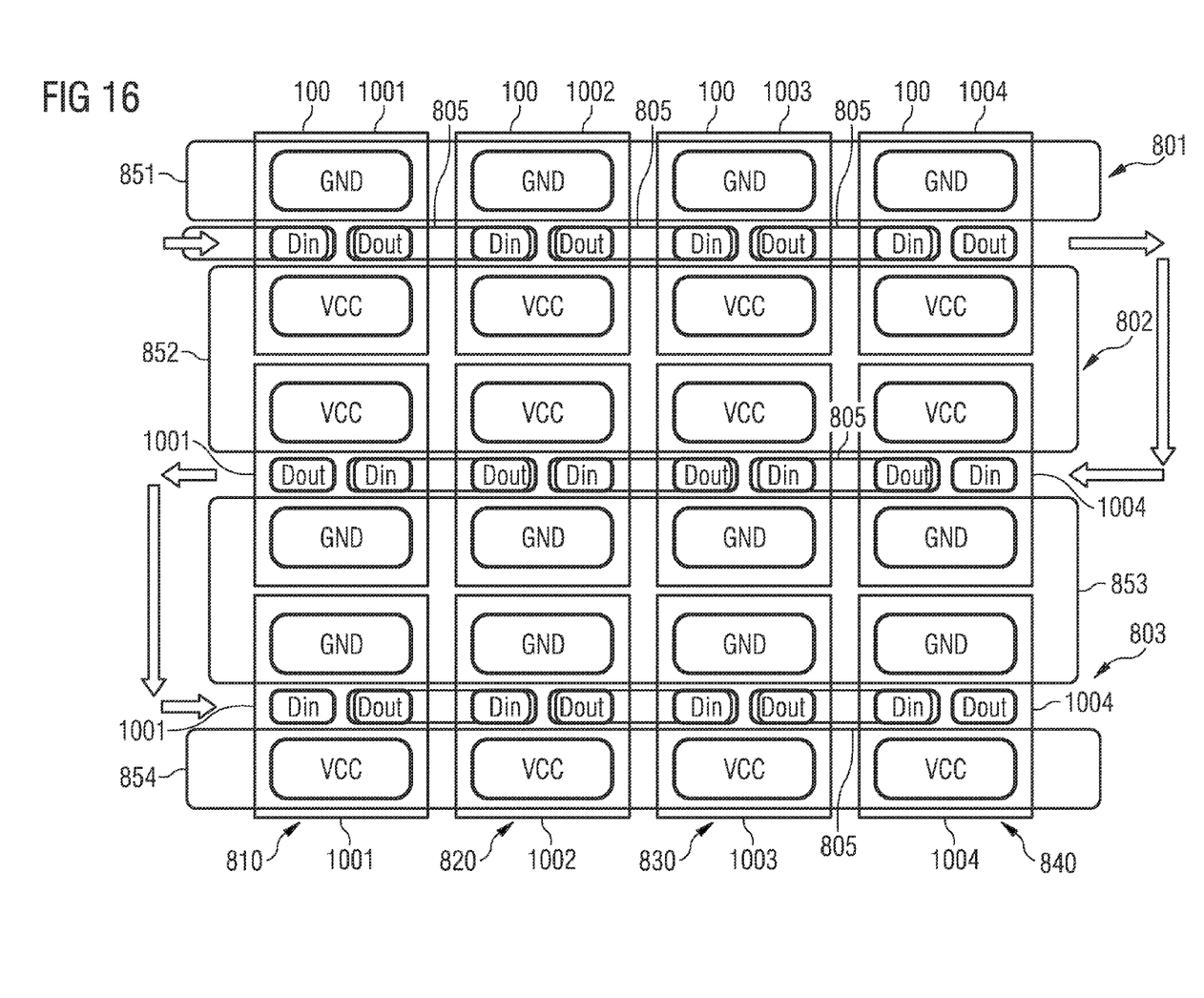
FIG. 16 shows the rear side of an array of semiconductor components.

FIG. 16 shows an array comprising a multiplicity of semiconductor components 100 arranged in rows and columns. The array in FIG. 16 an exemplary arrangement comprising twelve semiconductor components 100 arranged in an array having three rows 801, 802, 803 and four columns 810, 810, 830, 840, in the case of which semiconductor components the supply voltage is applied in parallel. Each row 801, 802, 803 in this exemplary embodiment has a first, second, third and fourth semiconductor component 1001, 1002, 1003, 1004. The semiconductor components 1001, 1002, 1003, 1004 in the rows 801, 802, 803 are arranged in such a way that the contact regions 350 for supply and reference potentials Vcc, GND are in each case adjacent. The same applies to the arrangement of the semiconductor components 100 in the columns 810, 820, 830, 840. As a result, the orientation of the semiconductor components 1001, 1002, 1003, 1004 in a row and the orientation of the semiconductor components 1001, 1002, 1003, 1004 in the adjacent row are shifted by 180 degrees with respect to one another.

The semiconductor components 1001, 1002, 1003, 1004 in the first and third rows 801, 803 are arranged in such a way that the contact region 350 for the reference potential GND is at the top and the contact region 350 for the supply potential Vcc is at the bottom. The semiconductor components 1001, 1002, 1003, 1004 in the second row 802 are arranged in such a way that the contact region 350 for the reference potential GND is at the bottom and the contact region 350 for the supply potential Vcc is at the top. This makes it possible that a conductor track can be used to make contact with not only the contact regions 350 for the supply potential Vcc in a row, but also the adjacent contact regions 350 for the supply potential Vcc in the adjacent row. The same applies to the contacting of the contact regions 350 for the reference potential GND of two adjacent rows.

By means of a first conductor track 851, the contact regions 350 for the reference potential GND of the first row 801 are contacted and the reference potential GND is applied thereto. By means of a second conductor track 852, the contact regions 350 for the supply potential Vcc of the first and second rows 801, 802 are contacted and the supply potential Vcc is applied thereto. By means of a third conductor track 853, the contact regions 350 for the reference potential GND of the second and third rows 802, 803 are contacted and the reference potential GND is applied thereto. By means of a fourth conductor track 854, the contact regions 350 for the supply potential Vcc of the third row 803 are contacted and the supply potential Vcc is applied thereto.

The contact areas for data inputs and outputs Din, Dout of each row 801, 802, 803 are contacted by conductor tracks 805 as described for FIG. 15. Contact areas for data inputs and outputs Din, Dout of two adjacent semiconductor components 100 are arranged in an adjacent fashion. Furthermore, the semiconductor components 100 of two adjacent rows which are situated at the same outer side of the array are coupled in such a way that the contact area for data output Dout of one semiconductor component is coupled to the contact area for data input Din of the other semiconductor component 100. A meandering data passage through the array is thus achieved, which is indicated by the arrows.

The data are present on the input side at the first semiconductor component 1001 of the first row 801. The data output of the first row 801, that is to say the contact area for data output Dout of the fourth or last semiconductor component 1004 of the first row 801, is coupled to the data input of the second row 802, that is to say the contact area for data input Din of the fourth or last semiconductor component 1004 of the second row 802. The data output of the second rows 802, that is to say the contact area for data output Dout of the first semiconductor component 1001 of the second row 802, is coupled to the data input of the third row 803, that is to say the contact area for data input Din of the first semiconductor component 1001 of the third row 803.

This array arrangement enables a small or minimal distance between the semiconductor components 100. The same potential is always present at the contact areas 350 of the adjacent component 100, as a result of the connection to the conductor tracks 851, 852, 853, 854, 805. The semiconductor components 100 can be positioned more closely since it is not necessary to comply with potential-dictated distances on the printed circuit board.

The above-described semiconductor components and their arrangement can be used, for example, for automobile headlights which change their luminous direction during cornering (AFS, abbreviation of "advanced front-lighting system"). Such semiconductor components can be mounted, for example, as described in WO2013/149772.

A further example of an integrated functional region is means for storing correction values for the white balance, for example, in the case of RGB LED arrangements for different temperatures or after burn-in for initial aging. Storage means can be provided for this purpose.

In one exemplary embodiment, provision can be made of LEDs for non-standard colors, for example, cyan for dynamic flashing indicator applications or user-specific colors.

In one exemplary embodiment, provision can be made of different voltage classes ("voltage binning") for different functional regions or components in order to keep the voltage overhead small in the case of different voltage ranges of the LEDs. This can be used in the case of high-current LEDs.

It should be noted that the features of the exemplary embodiments can be combined with one another. Further exemplary embodiments comprise circuit elements for current and voltage supply which are integrated wholly or partly on the carrier substrate, for example, a current source, as described further above.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor component comprising:
a plurality of first functional regions, each first functional region comprising an active zone provided for generating or receiving radiation; and
a second functional region comprising a serial shift register and a driver or parts of a driver for the first functional regions, the second functional region being configured to generate a plurality of signals for driving the first functional regions,
wherein the first functional regions and the second functional region are integrated on the same carrier substrate, wherein the second functional region is configured to generate a pulse width modulation signal, and
wherein the second functional region extends at least partly between the active zones of two of the plurality of first functional regions, or
wherein the active zone of the first functional region extends in an epitaxial layer below which the second functional region at least partly extends.

2. The optoelectronic semiconductor component according to claim 1, wherein the second functional region comprises a plurality of switches, each switch coupled in parallel with one of the first functional regions.

3. The optoelectronic semiconductor component according to claim 1, wherein the second functional region comprises a transistor.

4. The optoelectronic semiconductor component according to claim 1, wherein the first functional regions are coupled in series and a switch is coupled in parallel with at least one of the first functional regions.

5. The optoelectronic semiconductor component according to claim 1, wherein the serial shift register has a data input and a plurality of signal outputs.

6. The optoelectronic semiconductor component according to claim 5, wherein the signal outputs are electrically conductively connected to switches and each of the switches is coupled in parallel with one of the first functional regions.

7. The optoelectronic semiconductor component according to claim 1, wherein the second functional region comprises a resistor or complementary transistors.

8. The optoelectronic semiconductor component according to claim 1, further comprising connections to apply an external data signal and an external clock signal and an external supply voltage or an external supply current, and an external data signal provided at an output connection.

9. The optoelectronic semiconductor component according to claim 1, further comprising connections to apply an external data signal and connections to apply an external supply voltage or an external supply current, and an external data signal provided at an output connection.

10. The optoelectronic semiconductor component according to claim 1, wherein the carrier substrate is a silicon substrate.

11. The optoelectronic semiconductor component according to claim 1, wherein the first functional region comprises an LED.

12. An optoelectronic semiconductor component comprising:
a carrier substrate;
a first functional region integrated on the carrier substrate, the first functional region comprising a plurality of LEDs; and
a second functional region integrated on the carrier substrate, wherein the second functional region comprises a serial shift register having a data input and being suitable for contributing to driving of the first functional region, wherein the second functional region is configured to generate a pulse width modulation signal, and
wherein the shift register extends at least partly between active zones of two of the plurality of LEDs, or
wherein an active zone of the LEDs extends in an epitaxial layer, the shift register extending at least partially below the epitaxial layer.

13. An optoelectronic semiconductor component comprising:
a plurality of LEDs disposed in a substrate, the LEDs being coupled in series;
a plurality of transistors disposed in the substrate, each transistor having a control input and a current path coupled in parallel with an associated one of the LEDs; and
a shift register disposed in the substrate, the shift register having a plurality of outputs, each output being coupled to the control input of an associated transistor, wherein the shift register extends at least partly between active zones of two of the plurality of LEDs, or wherein an active zone of the LEDs extends in an epitaxial layer, the shift register extending at least partially below the epitaxial layer.

14. The optoelectronic semiconductor component according to claim 13, wherein the shift register is configured to generate a plurality of pulse width modulation signals.

15. The optoelectronic semiconductor component according to claim 13, further comprising connections to apply an external data signal and an external clock signal and an external supply voltage or an external supply current, and an external data signal provided at an output connection.

16. An optoelectronic semiconductor component comprising:
a plurality of first functional regions, each first functional region comprising an active zone provided for generating or receiving radiation; and
a second functional region comprising a serial shift register and a driver or parts of a driver for the first functional regions, the second functional region being configured to generate a plurality of signals for driving the first functional regions, wherein the first functional regions and the second functional region are integrated on the same carrier substrate, and
wherein the second functional region extends at least partly between the active zones of two of the plurality of first functional regions, or
wherein the active zone of the first functional region extends in an epitaxial layer below which the second functional region at least partly extends.

17. An optoelectronic semiconductor component comprising:
a carrier substrate;
a first functional region integrated on the carrier substrate, the first functional region comprising an active zone provided for generating radiation or for receiving radiation; and
a second functional region integrated on the carrier substrate, wherein the second functional region comprises a serial shift register having a data input and being suitable for contributing to driving of the first functional region, and
wherein the second functional region extends at least partly between the active zones of two of a plurality of first functional regions, or
wherein the active zone of the first functional region extends in an epitaxial layer below which the second functional region at least partly extends.

18. An optoelectronic semiconductor component comprising:
a plurality of LEDs disposed in a substrate, the LEDs being coupled in series;
a plurality of transistors disposed in the substrate, each transistor having a control input and a current path coupled in parallel with an associated one of the LEDs; and
a shift register disposed in the substrate, the shift register having a plurality of outputs, each output being coupled to the control input of an associated transistor,
wherein the shift register extends at least partly between active zones of two of the plurality of LEDs, or
wherein an active zone of the LEDs extends in an epitaxial layer, the shift register extending at least partially below the epitaxial layer.

* * * * *